US011082605B2

(12) United States Patent
Zeng

(10) Patent No.: US 11,082,605 B2
(45) Date of Patent: Aug. 3, 2021

(54) METHOD OF PHOTOGRAPHY PROCESSING FOR CAMERA MODULE, TERMINAL, USING SAME AND STORAGE MEDIUM IMPLEMENTING SAME

(71) Applicant: Guangdong OPPO Mobile Telecommunications Corp., Ltd., Guangdong (CN)

(72) Inventor: Yuanqing Zeng, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 0 days.

(21) Appl. No.: 16/664,313

(22) Filed: Oct. 25, 2019

(65) Prior Publication Data
US 2020/0059604 A1 Feb. 20, 2020

Related U.S. Application Data

(63) Continuation of application No. PCT/CN2018/083950, filed on Apr. 20, 2018.

(30) Foreign Application Priority Data

Apr. 28, 2017 (CN) .......................... 201710300310.9

(51) Int. Cl.
*H04N 5/232* (2006.01)
*H04N 5/225* (2006.01)
*H04N 5/369* (2011.01)

(52) U.S. Cl.
CPC ..... *H04N 5/232122* (2018.08); *H04N 5/2254* (2013.01); *H04N 5/23212* (2013.01); *H04N 5/36961* (2018.08)

(58) Field of Classification Search
CPC .......... H04N 5/232122; H04N 5/2254; H04N 5/36961; H04N 5/23212; H04N 5/2253; H04N 5/2251; G03B 13/36; G02B 7/346
See application file for complete search history.

(56) References Cited

U.S. PATENT DOCUMENTS

2002/0121652 A1 9/2002 Yamasaki
2006/0110150 A1 5/2006 Kurosawa
(Continued)

FOREIGN PATENT DOCUMENTS

CN 102025903 A 4/2011
CN 103069325 A 4/2013
(Continued)

OTHER PUBLICATIONS

European search report, EP18790392 dated Nov. 26, 2019 (9 pages).
(Continued)

*Primary Examiner* — Nelson D. Hernández Hernández

(57) ABSTRACT

The present disclosure provides a photography processing method for a camera module, a terminal, and a computer-readable storage medium. The method includes: controlling the photosensitive unit array to enter a focusing mode; reading a first set of output values of the M pairs of first focusing photosensitive units; reading a second set of output values of the N pairs of second focusing photosensitive units; performing focusing control according to the first set of output values and the second set of output values.

18 Claims, 7 Drawing Sheets

(56) References Cited

U.S. PATENT DOCUMENTS

| | | | | |
|---|---|---|---|---|
| 2013/0182173 | A1* | 7/2013 | Murata | H01L 27/286 |
| | | | | 348/349 |
| 2014/0185870 | A1 | 7/2014 | Yoshida | |
| 2014/0192249 | A1 | 7/2014 | Kishi | |
| 2014/0198245 | A1* | 7/2014 | Kunugi | H04N 5/23212 |
| | | | | 348/349 |
| 2016/0006926 | A1* | 1/2016 | Ui | G02B 3/0056 |
| | | | | 348/345 |
| 2016/0094779 | A1* | 3/2016 | Arakawa | H04N 5/23212 |
| | | | | 348/348 |
| 2018/0176452 | A1* | 6/2018 | Nikkanen | H04N 5/3696 |

FOREIGN PATENT DOCUMENTS

| | | | |
|---|---|---|---|
| CN | 103376617 | A | 10/2013 |
| CN | 104104849 | A | 10/2014 |
| CN | 104519327 | A | 4/2015 |
| CN | 105338263 | A | 2/2016 |
| CN | 105814877 | A | 7/2016 |
| CN | 106257679 | A | 12/2016 |
| CN | 106358026 | A | 1/2017 |
| CN | 106921823 | A | 7/2017 |
| CN | 106973206 | A | 7/2017 |
| EP | 2903259 | A1 | 8/2015 |
| WO | 2011126103 | A1 | 10/2011 |

OTHER PUBLICATIONS

Chinese Third Office Action ,Chinese Application No. 201710300310.9, dated Jan. 6, 2020 (4 pages).

English translation of The National Intellectual Property Administration of Peopele's Republic of China, Notification of Grant Patent for CN Application 201710300310.9, dated Apr. 7, 2020 (7 pages).

English translation of Second Office Action from China patent office in a counterpart Chinese patent Application 201710300310.9, dated Mar. 4, 2019 (8 pages).

English translation of Reject the decision from China patent office in a counterpart Chinese patent Application 201710300310.9, dated Jun. 5, 2019 (7 pages).

European examination report, EP18790392, dated Jul. 3, 2020 (4 pages).

International search report, PCT/CN2018/083950, dated Jul. 9, 2018 (4 pages).

OA with English Translation for a counterpart Chinese patent Application 201710300310.9, dated Sep. 5, 2018 (16 pages).

India First Examination Report for IN Application 201917046535 dated Feb. 10, 2021. (5 pages).

European Examination Report for EP Application 18790392.7 dated Feb. 9, 2021. (4 pages).

* cited by examiner

METHOD OF PHOTOGRAPHY PROCESSING FOR CAMERA MODULE, TERMINAL, USING SAME AND STORAGE MEDIUM IMPLEMENTING SAME

CROSS-REFERENCE TO RELATED APPLICATION(S)

The present application is a continuation application of International (PCT) Patent Application No. PCT/CN2018/083950 filed on Apr. 20, 2018, which claims priority to Chinese Patent Application No. 201710300310.9, filed on Apr. 28, 2017, the entire contents of both of which are hereby incorporated by reference.

TECHNICAL FIELD

The present disclosure relates to the technical field of image processing, particularly to a photography processing method for a camera module, a terminal, and a computer-readable storage medium.

BACKGROUND

Dual-core full-pixel focusing technology is the most advanced focusing technology on the market at present. This technology arranges two photodiodes in a pixel point of an image sensor, thereby making it possible to effectively complete phase difference detection without covering any pixel. Therefore, compared with a traditional focusing method in which a sensor with only one photodiode in a pixel is used for focusing, the dual-core full-pixel focusing technology has higher focusing accuracy and speed, and involves a wider effective range of focusing due to no need to sacrifice imaging pixels.

However, the present inventor has realized that focusing accuracy and speed of the existing dual-core full-pixel focusing technology still remain to be improved.

SUMMARY

A first aspect of the present disclosure provides a photography processing method for a camera module, wherein the camera module includes an image sensor and the image sensor includes a photosensitive unit array, a filter unit array arranged on the photosensitive unit array, and a microlens unit array arranged on the filter unit array; wherein the photosensitive unit array includes M pairs of first focusing photosensitive units with center lines parallel to each other and N pairs of second focusing photosensitive units with center lines parallel to each other, and a microlens unit covers a filter unit and a pair of focusing photosensitive units; wherein an intersection angle between a center line of a pair of first focusing photosensitive units and a center line of a pair of second focusing photosensitive units is greater than 0 degree, and M and N are positive integers greater than or equal to 1; wherein the method includes the following operations: controlling the photosensitive unit array to enter a focusing mode; reading a first set of output values of the M pairs of first focusing photosensitive units; reading a second set of output values of the N pairs of second focusing photosensitive units; and performing focusing control according to the first set of output values and the second set of output values.

A second aspect of the present disclosure provides a terminal. The terminal includes a housing, a circuit board, a camera module, and a power supply circuit, wherein the circuit board is disposed in an inner space enclosed by the housing, and the power supply circuit is configured to power each circuit or component of the terminal; wherein the camera module includes an image sensor, the image sensor includes a photosensitive unit array, a filter unit array arranged on the photosensitive unit array, and a microlens unit array arranged on the filter unit array; wherein the photosensitive unit array includes M pairs of first focusing photosensitive units with center lines parallel to each other and N pairs of second focusing photosensitive units with center lines parallel to each other, a microlens unit covers a filter unit and a pair of focusing photosensitive units; wherein an intersection angle between a center line of a pair of first focusing photosensitive units and a center line of a pair of second focusing photosensitive units is greater than 0 degree, and M and N are positive integers greater than or equal to 1.

A third aspect of the present disclosure provides a non-transitory computer-readable storage medium having a computer program stored thereon. The program, when executed by a processor, implements the photography processing method for a camera module as described according to the above first aspect.

BRIEF DESCRIPTION OF DRAWINGS

The above and/or additional aspects and advantages of the present disclosure will become apparent and readily understood in the description of the embodiments as given below in conjunction with the drawings.

DETAILED DESCRIPTION

Reference will now be made in detail to exemplary embodiments, examples of which are illustrated in the accompanying drawings, in which the same or similar reference numbers throughout the drawings represent the same or similar elements or elements having same or similar functions. Embodiments described below with reference to drawings are merely exemplary and used for explaining the present disclosure and should not be understood as limitation to the present disclosure.

An image sensor, a photography processing method for a camera module, a device, a camera module, and a terminal according to embodiments of the present disclosure are described below with reference to the accompanying drawings.

Figure 1:
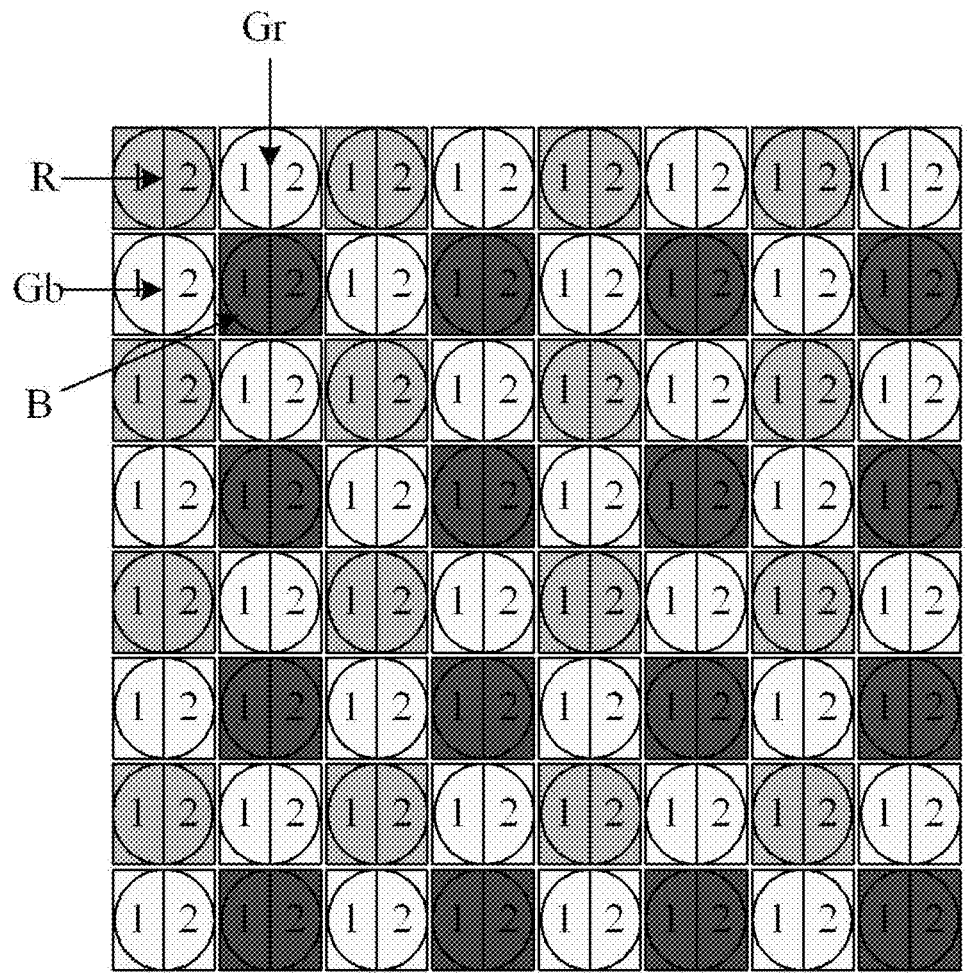
FIG. 1 is a structural diagram of a dual-core focusing image sensor of the related art.

Dual-core full-pixel focusing technology is the most advanced focusing technology on the market at present. A dual-core focusing sensor structure used in this focusing technology is shown in FIG. 1. Each microlens (circles in FIG. 1 represent microlenses) corresponds to two photodiodes under this microlens. When imaging processing is performed, values of "1" and "2" are added to obtain a single-component pixel value. When focusing processing is performed, the values of "1" and "2" are read respectively, and the driving amount and driving direction of the camera lens can be calculated by calculating a phase difference between the two.

Since two photodiodes in the focusing photosensitive unit are arranged in parallel in the current image sensor, only a phase difference of the pixel point in a horizontal direction can be detected.

In order to solve the problem that the existing dual-core full-pixel focusing technology can only detect the phase difference of the pixel point in the horizontal direction, the present disclosure provides an image sensor and photography processing method for a camera module. In the image sensor, a plurality of focusing photosensitive units where photodiodes are arranged in different directions are provided to detect phase differences of the pixel point in multiple directions. Therefore, focusing speed is effectively improved, and the precision and accuracy of the dual-core focusing are enhanced.

Figure 2:
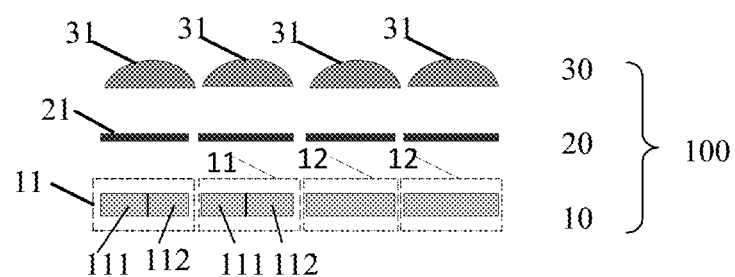
FIG. 2 is a sectional view of an image sensor according to an embodiment of the present disclosure.
Figure 3:
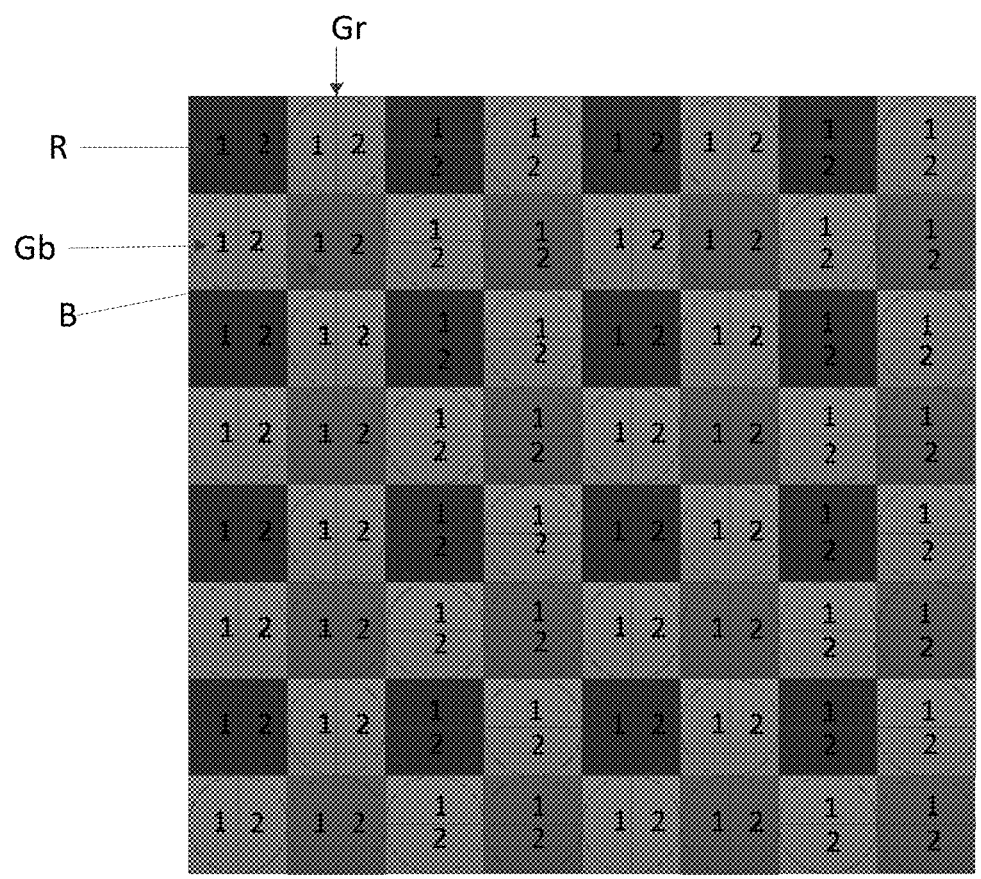
FIG. 3 is a top view of an image sensor according to an embodiment of the present disclosure.

The image sensors provided by embodiments of the present disclosure will be detailed first in conjunction with FIG. 2 and FIG. 3.

FIG. 2 is a sectional view of an image sensor according to an embodiment of the present disclosure, and FIG. 3 is a top view of an image sensor according to an embodiment of the present disclosure. FIG. 2 shows only a part of the image sensor.

As shown in FIG. 2 and FIG. 3, the image sensor 100 includes a photosensitive unit array 10, a filter unit array 20, and a microlens unit array 30.

The filter unit array 20 is arranged on the photosensitive unit array 10, and the microlens unit array 30 is arranged on the filter unit array 20. The photosensitive unit array 10 includes M pairs of first focusing photosensitive units 11 with center lines parallel to each other and N pairs of second focusing photosensitive units 12 with center lines parallel to each other. A microlens unit 31 covers a filter unit 21 and a pair of focusing photosensitive units. A center line of each pair of focusing photosensitive units is parallel to an arrangement direction of the pair of focusing photosensitive units.

An intersection angle between a center line of a pair of first focusing photosensitive units 11 and a center line of a pair of second focusing photosensitive units 12 is greater than 0 degree, and M and N are positive integers greater than or equal to 1.

In an embodiment of the present disclosure, the center line of the pair of first focusing photosensitive units 11 and the center line of the pair of second focusing photosensitive units 12 refer to a center line between a photodiode 111 and a photodiode 112 in FIG. 2 and a center line between "1" and "2" in FIG. 3.

In an embodiment of the present disclosure, the filter unit array 20 adopts a Bayer pattern which can use a traditional algorithm for the Bayer pattern to process image signals without involving a need for making a large adjustment in the hardware structure. Each filter unit 21 corresponds to a pair of focusing photosensitive units, i.e., a pair of focusing photosensitive units correspond to a filter unit 21 of the same color. A pair of focusing photosensitive units correspond to two sub-pixel points and two photodiodes 111 and 112. The two photodiodes 111 and 112 correspond to "1" and "2" in FIG. 3, respectively.

In an embodiment of the present disclosure, since an intersection angle between a center line of a pair of first focusing photosensitive units 11 and a center line of a pair of second focusing photosensitive units 12 is greater than 0 degree, it is meant that the M pairs of first focusing photosensitive units 11 and the N pairs of second focusing photosensitive units 12 in the photosensitive unit array 10 are arranged in different directions in the image sensor 100.

Therefore, when the image sensor 100 provided by an embodiment of the present disclosure is used to perform focusing, signals are captured by corresponding two photodiodes of each pair of focusing photosensitive units in the photosensitive unit array 10, respectively. Since the photosensitive unit array 10 includes focusing photosensitive units having different arrangement directions, it is possible to detect phase differences and deviation directions of the pixel points in two different directions, thereby accurately calculating a direction and distance in which the camera lens should move and thus completing focusing. As compared with the existing dual-core full-pixel focusing technology which determines the direction and distance in which the camera lens should move by only detecting the phase difference and deviation direction of the pixel point in the horizontal direction, the image sensor 100 provided by the embodiment of the present disclosure is used to achieve higher focusing precision and accuracy.

It is understood that, in the photosensitive unit array 10 of the embodiments of the present disclosure, the M pairs of first focusing photosensitive units 11 and the N pairs of second focusing photosensitive units 12 can be arranged in the image sensor 100 in any different arrangement directions. For example, the M pairs of first focusing photosensitive units 11 are arranged in a manner that the center lines thereof are parallel to a horizontal direction of the image sensor 100, and the N pairs of second focusing photosensitive units 12 are arranged in a manner that the center lines thereof are parallel to a diagonal line of the image sensor 100; alternatively, the M pairs of first focusing photosensitive units 11 are arranged in a manner that the center lines thereof are perpendicular to a horizontal direction of the image sensor 100, and the N pairs of second focusing photosensitive units 12 are arranged in a manner that the center lines thereof are parallel to a diagonal line of the image sensor 100; or the like.

In a preferred implementation form of the present disclosure, the center line of each pair of first focusing photosensitive units 11 is perpendicular to the center line of each pair of second focusing photosensitive units 12. Thus, when focusing is performed, the first focusing photosensitive units 11 and the second focus sensing units 12 can detect phase differences of each pixel in two mutually perpendicular directions. Since the phase differences in the two directions are independent of each other, it is possible to rapidly calculate the distance in which the camera lens should move according to the phase differences in the two directions, thereby rapidly completing the focusing.

In specific implementation, the pair number M of the first focusing photosensitive units 11 and the pair number N of the second focusing photosensitive units 12 can be set as required. Specifically, the pair number M of the first focusing photosensitive units 11 and the pair number N of the second focusing photosensitive units 12 may be equal or may not be equal, without any limitation set herein.

When M=N, the image sensor 100 can achieve better consistency of focusing precision and accuracy in two directions.

It should be noted that, as shown in FIG. 3, all the photosensitive unit arrays 10 on the image sensor 100 can be configured as first focusing photosensitive units 11 and second focusing photosensitive units 12 to achieve dual-core full-pixel focusing. Moreover, M pairs of first focusing photosensitive units 11 and N pairs of second focusing photosensitive units 12 may be distributed on the image sensor 100 in any form. For example, the first focusing photosensitive units 11 and the second focusing photosensitive units 12 may also be arranged alternately on the image sensor 100.

In a possible implementation form of the present disclosure, M pairs of first focusing photosensitive units 11 and N pairs of second focusing photosensitive units 12 may be arranged on a vertical center line and a horizontal center line of the image sensor 100, respectively.

Alternatively, M pairs of first focusing photosensitive units 11 and N pairs of second focusing photosensitive units 12 may also be arranged on two diagonal lines of the image sensor 100, respectively.

Figure 4:
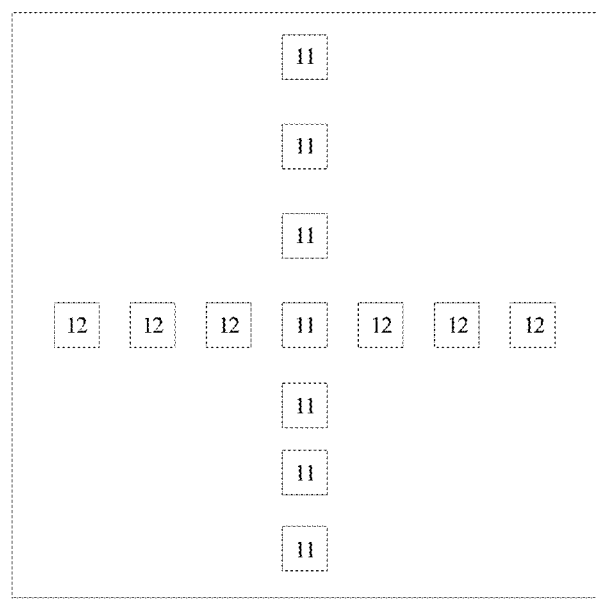
FIG. 4 is a diagram showing the distribution of focusing photosensitive units in an image sensor according to an embodiment of the present disclosure.

For example, assuming M=7, N=6, center lines of M pairs of first focusing photosensitive units 11 are parallel to a horizontal direction of the image sensor 100, and center lines of N pairs of second focusing photosensitive units 12 are perpendicular to the horizontal direction of the image sensor 100. Accordingly, as shown in FIG. 4, M pairs of first focusing photosensitive units 11 may be arranged on a vertical center line of the image sensor 100, and N pairs of second focusing photosensitive units 12 may be arranged on a horizontal center line of the image sensor 100. Alternatively, it is also possible to arrange the M pairs of first focusing photosensitive units 11 on the horizontal center line of the image sensor 100, and arrange the N pairs of second focusing photosensitive units 12 on the vertical center line of the image sensor 100.

In addition, an intensive degree of the M pairs of first focusing photosensitive units 11 and the N pairs of second focusing photosensitive units 12 when arranged in the image sensor 100 can also be set as required. For example, the M pairs of first focusing photosensitive units 11 can be intensively distributed in the middle of the image sensor 100, and the N pairs of second focusing photosensitive units 12 can be scatteredly distributed in the edge of the image sensor 100, and the like.

It should be noted that a user, when performing photographing, usually locates an object to be shot in a middle region of the image, and thus, when the image sensor is provided with focusing photosensitive units, it is possible to configure density of the focusing photosensitive units arranged on the vertical center line and horizontal center line of the image sensor to be greater than that of the focusing photosensitive units arranged on two diagonal lines of the image sensor. As such, during the photographing process, the phase information of the center of the image can be preferentially obtained, and the focusing speed can be effectively improved without affecting the image quality.

It can be learned from the above analysis that, by configuring focusing photosensitive units having two different arrangement directions in the photosensitive unit array 10 of the image sensor 100, it is possible to accurately calculate the direction and distance in which the camera lens should move to achieve focusing, through detection of phase differences and deviation directions of the pixel point in two different directions after two photodiodes included in each pair of focusing photosensitive units capture signals respectively. In a possible implementation form of the present disclosure, focusing photosensitive units having three or more arrangement directions may also be arranged in the photosensitive unit array 10, so as to achieve higher focusing precision and accuracy.

That is, the photosensitive unit array 10 may further include: L pairs of third focusing photosensitive units with center lines parallel to each other, where L is a positive integer greater than or equal to 1.

A pair of third focusing photosensitive units are covered by a filter unit 21 and a microlens unit 31, respectively.

Both an intersection angle between a center line of a pair of third focusing photosensitive units and a center line of a pair of first focusing photosensitive units 11 and an intersection angle between the center line of the pair of third focusing photosensitive units and a center line of a pair of second focusing photosensitive units 12 are greater than 0 degree.

Figure 5:
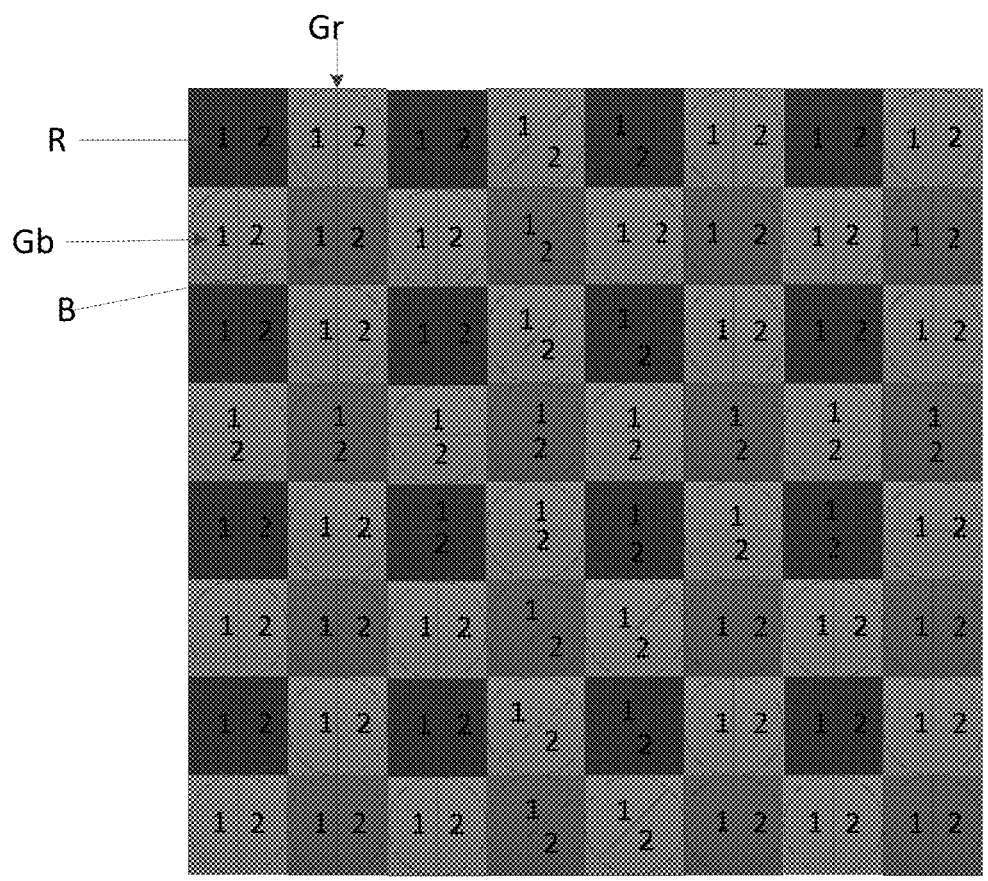
FIG. 5 is a diagram showing the distribution of focusing photosensitive units in an image sensor according to another embodiment of the present disclosure.

For example, as shown in FIG. 5, assuming M=12, N=16, and L=36, center lines of M pairs of first focusing photosensitive units 11 may be at an angle of 45 degrees with a horizontal direction of the image sensor 100; center lines of N pairs of second focusing photosensitive units 12 may be parallel to the horizontal direction of the image sensor 100; and center lines of L pairs of third focusing photosensitive units may be perpendicular to the horizontal direction of the image sensor 100.

In specific implementation, similar to the case that focusing photosensitive units having two different photodiode arrangement directions are arranged in the photosensitive unit array 10, M pairs of first focusing photosensitive units 11, N pairs of second focusing photosensitive units 12 and L pairs of third focusing photosensitive units can also be arranged at any position of the image sensor 100.

For example, M pairs of first focusing photosensitive units 11, N pairs of second focusing photosensitive units 12, and L pairs of third focusing photosensitive units may be arranged at the horizontal center line, the first diagonal line and the second diagonal line of the image sensor 100, respectively.

Alternatively, M pairs of first focusing photosensitive units 11, N pairs of second focusing photosensitive units 12, and L pairs of third focusing photosensitive units may be arranged at the vertical center line, the first diagonal line and the second diagonal line of the image sensor 100, respectively; or the like.

The image sensor provided by the embodiments of the present disclosure comprises: a photosensitive unit array, a filter unit array arranged on the photosensitive unit array, and a microlens unit array arranged on the filter unit array. By providing the photosensitive unit array with pairs of focusing photosensitive units having a plurality of arrangement directions, the hardware basis is provided to detect phase differences of the pixel point in a plurality of directions and improve speed, precision, and accuracy of the dual-core focusing.

Based on the structure of the image sensor 100 in FIG. 1 to FIG. 5, an embodiment of the present disclosure further provides a camera module.

Figure 6:
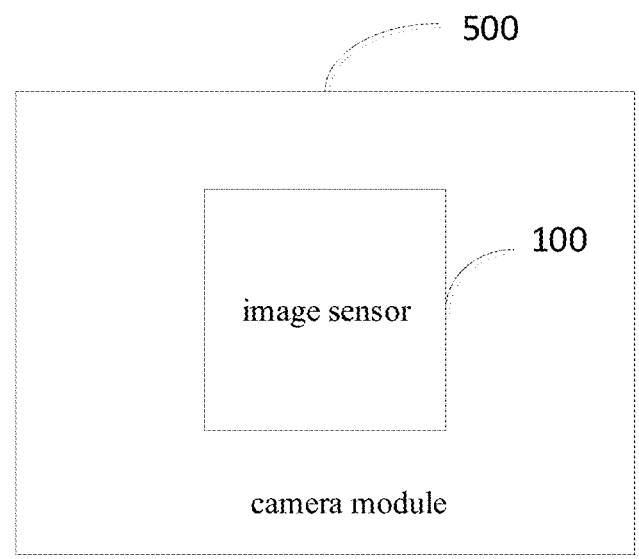
FIG. 6 is a diagram of a camera module according to an embodiment of the present disclosure.

As shown in FIG. 6, the camera module 500 includes an image sensor 100.

Specifically, the image sensor 100 includes: a photosensitive unit array 10, a filter unit array 20 arranged on the photosensitive unit array 10, and a microlens unit array 30 arranged on the filter unit array 20;

The photosensitive unit array 10 includes M pairs of first focusing photosensitive units 11 and N pairs of second focusing photosensitive units 12. A microlens unit 31 covers a filter unit and a pair of focusing photosensitive units. A center line of each pair of focusing photosensitive units is parallel to the arrangement direction of the pair of focusing photosensitive units.

An intersection angle between a center line of a pair of first focusing photosensitive units 11 and a center line of a pair of second focusing photosensitive units 12 is greater than 0 degree; and M and N are positive integers greater than or equal to one.

It should be noted that, the foregoing explanation of the embodiments of the image sensor is also applicable to the camera module in this embodiment. The implementation principles thereof are similar, and details are not described herein again.

In the camera module provided by the embodiment of the present disclosure, the image sensor includes a photosensitive unit array, a filter unit array arranged on the photosensitive unit array, and a microlens unit array arranged on the filter unit array. By providing the photosensitive unit array with pairs of focusing photosensitive units having a plurality of arrangement directions, it is possible to realize detecting phase differences of the pixel point in a plurality of directions and improving speed, precision, and accuracy of the dual-core focusing.

Based on the structure of the camera module in FIG. 6, a photography processing method for a camera module according to an embodiment of the present disclosure will be described below in conjunction with FIG. 7.

Specifically, a camera module 500 includes an image sensor 100 provided by the embodiment of the present disclosure.

The structure of the image sensor 100 is shown in FIG. 1 to FIG. 5, and details are not described herein again.

Figure 7:
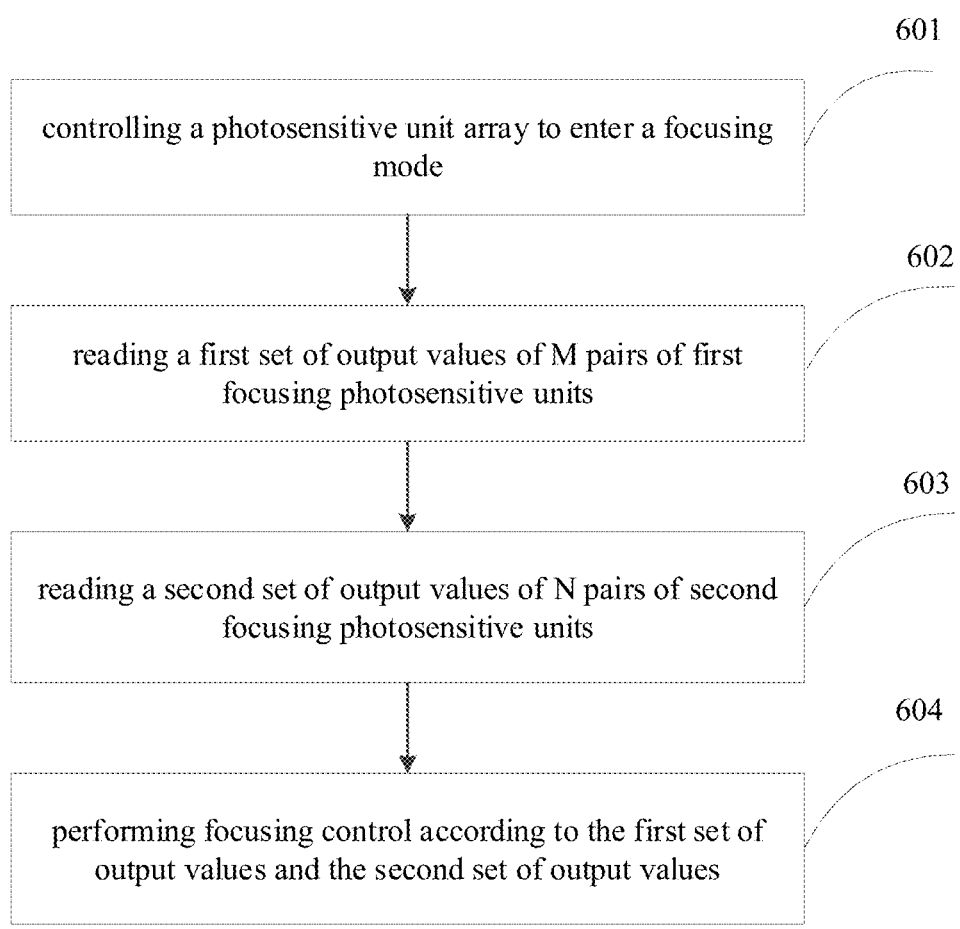
FIG. 7 is a flow chart of a photography processing method for a camera module according to an embodiment of the present disclosure.

FIG. 7 is a flow chart of a photography processing method for a camera module according to an embodiment of the present disclosure.

As shown in FIG. 7, the method comprises the following blocks.

Block 601: controlling a photosensitive unit array to enter a focusing mode.

Specifically, the camera module 500 can control a photosensitive unit array 10 to enter a focusing mode by means of various triggering manners. For example, a condition under which the photosensitive unit array 10 is controlled to enter the focusing mode may be set in advance. When an image acquired by the image sensor 100 satisfies the condition, the camera module 500 may control the photosensitive unit array 10 to automatically enter the focusing mode. Alternatively, the photosensitive unit array 10 may also be controlled to enter the focusing mode according to a user's need. For example, when the user touches a control button provided on the camera module 500, the photosensitive unit array 10 is controlled to enter the focusing mode, and so on.

Block 602: reading a first set of output values of M pairs of first focusing photosensitive units.

The first set of output values includes the output values of corresponding two photodiodes of each of M pairs of first focusing photosensitive units 11.

Block 603: reading a second set of output values of N pairs of second focusing photosensitive units.

The second set of output values includes output values of corresponding two photodiodes of each of N pairs of second focusing photosensitive units 12.

For example, with FIG. 3 as an example, FIG. 3 includes 32 pairs of first focusing photosensitive units 11 with center lines perpendicular to the horizontal direction of the image sensor 100, and 32 pairs of second focusing photosensitive units with center lines parallel to the horizontal direction of the image sensor 100. Accordingly, a first set of output values includes respective output values of two left and right photodiodes in the 32 pairs of first focusing photosensitive units 11; and a second set of output values includes respective output values of two upper and lower photodiodes in the 32 pairs of second focusing photosensitive units 12.

Block 604: performing focusing control according to the first set of output values and the second set of output values.

Specifically, subsequent to reading the first set of output values of the M pairs of first focusing photosensitive units 11 and the output values of the N pairs of second focusing photosensitive units 12, focusing control can be performed according to the following block, i.e., Block 604, which may specifically include:

Block 604a: determining a phase difference of an image currently acquired by the image sensor in a first direction according to the first set of output values.

The first direction is a direction perpendicular to center lines of the M pairs of first focusing photosensitive units 11.

Block 604b: determining a phase difference of the image in a second direction according to the second set of output values.

The second direction is a direction perpendicular to center lines of the N pairs of second focusing photosensitive units 12.

Still with FIG. 3 as an example, assuming $g_{roi}^L(x,y)$ is an output value of a corresponding left photodiode of a pair of first focusing photosensitive units 11 and $g_{roi}^R(x,y)$ is an output value of a corresponding right photodiode of a pair of first focusing photosensitive units 11, it is possible to determine a phase difference $\Delta x$ of the image currently acquired by the image sensor 100 in a horizontal direction according to the first set of output values of the M pairs of first focusing photosensitive units 11, by using the following equation:

$$\Delta x = \underset{x'}{\operatorname{argmin}} \left[ \sum_x \sum_y |g_{roi}^L(x+x', y) - g_{roi}^R(x, y)| \right],$$

where the phase difference $\Delta x$ in the horizontal direction is a phase difference when a difference between two images acquired respectively by corresponding two left and right photodiodes of the M pairs of first focusing photosensitive units 11 is minimal.

Likewise, assuming $g_{roi}^T(x,y)$ is an output value of a corresponding upper photodiode of a pair of second focusing photosensitive units 12 and $g_{roi}^D(x,y)$ is an output value of a corresponding lower photodiode of a pair of second focusing photosensitive units 12, it is possible to determine a phase difference $\Delta y$ of the image currently acquired by the image sensor 100 in a perpendicular direction according to the second set of output values of the N pairs of second focusing photosensitive units 12, by using the following equation:

$$\Delta y = \underset{y'}{\operatorname{argmin}}\left[\sum_{x}\sum_{y}|g_{roi}^{T}(x, y + y') - g_{roi}^{R}(x, y)|\right].$$

Block 604c: performing focusing control according to the phase difference in the first direction and the phase difference in the second direction.

Specifically, subsequent to determining the phase difference of the image currently acquired by the image sensor 100 in the first direction and the phase difference in the second direction, it is possible to determine a distance and direction in which the camera module 500 should move according to the phase differences, thereby completing focusing.

In specific implementation, it is possible to perform focusing control by means of various methods according to the phase difference in the first direction and the phase difference in the second direction.

Method 1: Determining a first displacement amount of the image sensor 100 in the first direction according to the phase difference in the first direction; determining a second displacement amount of the camera module 500 in the second direction according to the phase difference in the second direction; and controlling the camera module 500 to perform focusing according to the first displacement amount and the second displacement amount.

Specifically, after determining the displacement amounts of the image sensor 100 in the two directions respectively according to the phase differences in the two directions, it is possible to control the camera module 500 to move with corresponding distances in the two directions respectively, thereby completing focusing.

Method 2: Determining a phase difference of the image according to the phase difference in the first direction and the phase difference in the second direction; determining a rotation angle and a displacement amount of the camera module 500 according to the phase difference; and controlling the camera module 500 to perform focusing according to the rotation angle and the displacement amount.

Specifically, after determining the phase differences of the image in the two directions, it is possible to determine a phase difference of the image by means of a preset method. For example, a square sum of the phase differences in the two directions can be used as the phase difference of the image. Then, after determining the rotation angle and displacement amount of the camera module 500 according to the phase difference of the image, it is possible to control the camera module 500 to rotate with a corresponding angle and then to move with a corresponding distance, thereby completing focusing.

It could be understood that, the camera module 500 further includes a lens. When the camera module 500 is controlled for focusing, the image sensor 100 in the camera module 500 can be controlled to move, or the lens can also be controlled to move, thereby completing focusing.

The photography processing method for a camera module provided by the embodiment of the present disclosure first controls a photosensitive unit array to enter a focusing mode, and then reads a first set of output values of M pairs of first focusing photosensitive units and a second set of output values of N pairs of second focusing photosensitive units, respectively, followed by performing focusing control according to the first set of output values and the second set of output values. By providing the photosensitive unit array with pairs of focusing photosensitive units having a plurality of arrangement directions, and using read output values of the focusing photosensitive units having different arrangement directions, focusing is performed, thereby improving speed, precision, and accuracy of the dual-core focusing.

Further, after determining the phase difference of the image currently acquired by the image sensor in the first direction and the phase difference in the second direction in the above manner, it is also possible to determine a field depth of a shot object according to the phase difference, thereby performing blurring processing of the shot image. The photography processing method for a camera module provided by the embodiment of the present disclosure will be further described below in conjunction with FIG. 8.

Figure 8:
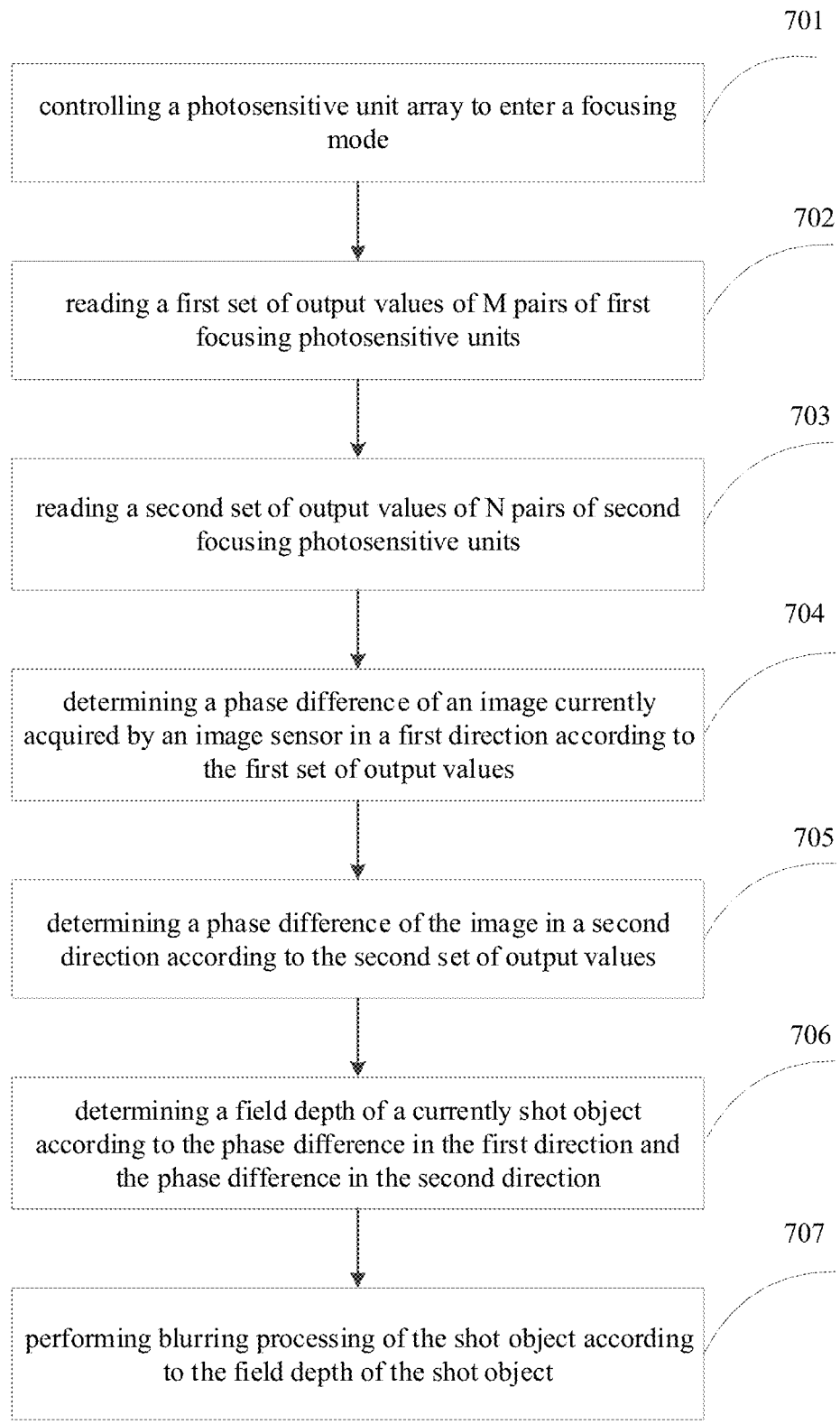
FIG. 8 is a flow chart of a photography processing method for a camera module according to another embodiment of the present disclosure.

FIG. 8 is a flow chart of a photography processing method for a camera module according to another embodiment of the present disclosure.

As shown in FIG. 8, the method comprises the following blocks.

Block 701: controlling a photosensitive unit array to enter a focusing mode.

Block 702: reading a first set of output values of M pairs of first focusing photosensitive units.

Block 703: reading a second set of output values of N pairs of second focusing photosensitive units.

Block 704: determining a phase difference of an image currently acquired by an image sensor in a first direction according to the first set of output values.

Block 705: determining a phase difference of the image in a second direction according to the second set of output values.

Block 702 and Block 703 can be performed simultaneously; Block 702 can be performed first and Block 703 may be then performed; or Block 703 can be performed first and Block 702 is then performed, without any limitation set herein.

Likewise, Block 704 and Block 705 can be performed simultaneously or sequentially.

Block 706: determining a field depth of a currently shot object according to the phase difference in the first direction and the phase difference in the second direction.

In the embodiment of the present disclosure, the field depth refers to a distance between the shot object and the microlens unit array.

Block 707: performing blurring processing of the shot object according to the field depth of the shot object.

Blurring is a common photographing technology. At the time of photographing, there is a focusing point in a viewfinder window. When the focusing point focuses on the shot object, a shutter is pressed thereby to make the shot object in the acquired image clear, with the background and other objects blurred.

According to the prior art, it is possible to divide shot space into multiple layers by means of a telephoto lens of a digital camera. For example, an object closest to the lens is a layer, a farther object is a layer, and a still farther object is another layer, and so on. By focusing the focus on one of the layers, the object in the layer can be clearly displayed, and the objects in adjacent layers before and behind the clear layer will be slightly blurred because they are not in focus, and the objects in the layers farther away from the clear layer will become more blurred. By superimposing these layers together, it is possible to form an image in which the shot object can be clearly displayed and other objects are displayed in a more blurred manner as they are more distant from the clear layer space.

Through the existing dual-core full-pixel focusing technology, it is possible to determine a field depth of a currently shot object according to a phase difference of an image currently acquired by an image sensor in one direction, so that the focus is on the layer where the shot object lies, to obtain an image having been subjected to burring processing.

However, in practical applications, when the image currently acquired by the image sensor has a relatively small phase difference in one direction, but has a relatively large phase difference in other directions, it could be impossible to accurately determine the field depth of the currently shot object and direct the focus to the layer where the shot object lies, by using the prior art, so that the blurring effect of the shot object is poor.

In the embodiment of the present disclosure, by providing the image sensor 100 with pairs of focusing photosensitive units having a plurality of arrangement directions, it is possible to determine phase differences of the image in different directions, so that when a phase difference in a certain direction is relatively small, it is also possible to more accurately and rapidly determine a field depth of the currently shot object and to direct the focus accurately to the layer where the shot object lies, thereby making the spatial and hierarchical sense of the obtained image stronger and achieving a better blurring effect.

For the specific implementation procedures and principles of the foregoing Blocks 701 to 705, reference may be made to the detailed description of Blocks 601-604 in the foregoing embodiments, and details are not described herein again.

The photography processing method for a camera module provided by the embodiment of the present disclosure first controls a photosensitive unit array to enter a focusing mode, and then reads a first set of output values of M pairs of first focusing photosensitive units and a second set of output values of N pairs of second focusing photosensitive units, respectively, followed by determining a field depth of a currently shot object according to the first set of output values and the second set of output values, thereby performing blurring processing of the shot object. By providing the photosensitive unit array with pairs of focusing photosensitive units having a plurality of arrangement directions and using read output values of the focusing photosensitive units having different arrangement directions, focusing is performed, thereby improving speed, precision and accuracy of the dual-core focusing, enhancing the spatial and hierarchical sense of the image acquired by the image sensor and optimizing a blurring effect on the image.

Based on the above embodiments, the present disclosure further provides a photographing processing device for a camera module.

Specifically, the camera module 500 includes an image sensor 100 provided by the embodiments of the present disclosure.

The structure of the image sensor 100 is shown in FIG. 1 to FIG. 5, and details are not described herein again.

Figure 9:
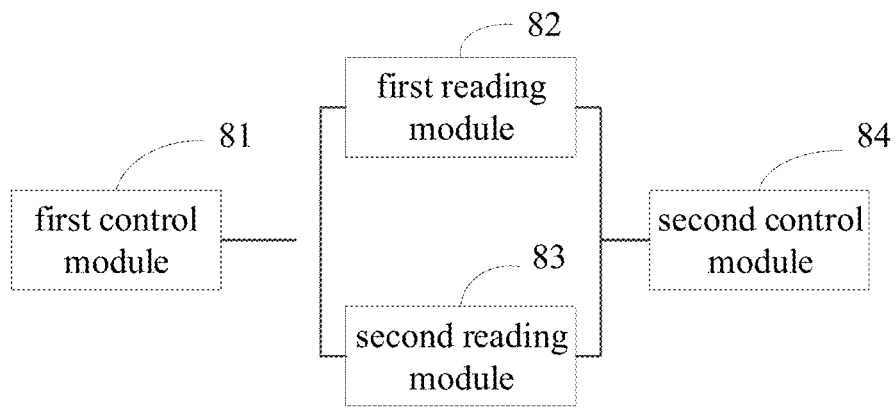
FIG. 9 is a structural diagram of a photographing processing device for a camera module according to an embodiment of the present disclosure.

FIG. 9 is a structural diagram of a photographing processing device for a camera module according to an embodiment of the present disclosure.

As shown in FIG. 9, the photographing processing device for a camera module includes: a first control module 81, configured to control the photosensitive unit array to enter a focusing mode; a first reading module 82, configured to read a first set of output values of the M pairs of first focusing photosensitive units; a second reading module 83, configured to read a second set of output values of the N pairs of second focusing photosensitive units; a second control module 84, configured to perform focusing control according to the first set of output values and the second set of output values.

The photographing processing device for a camera module provided by this embodiment may be arranged in any terminal to perform the photography processing method for a camera module in the foregoing embodiments.

It should be noted that, the explanation of the photography processing method for a camera module embodiment in the foregoing embodiments is also applicable to the photographing processing device for a camera module of this embodiment, and details are not described herein again.

The photographing processing device for a camera module provided by the embodiment of the present disclosure first controls a photosensitive unit array to enter a focusing mode, and then reads a first set of output values of M pairs of first focusing photosensitive units and a second set of output values of N pairs of second focusing photosensitive units, respectively, followed by performing focusing control according to the first set of output values and the second set of output values. By providing the photosensitive unit array with pairs of focusing photosensitive units having a plurality of arrangement directions and using read output values of the focusing photosensitive units having different arrangement directions, focusing is performed, thereby improving speed, precision, and accuracy of the dual-core focusing.

Figure 10:
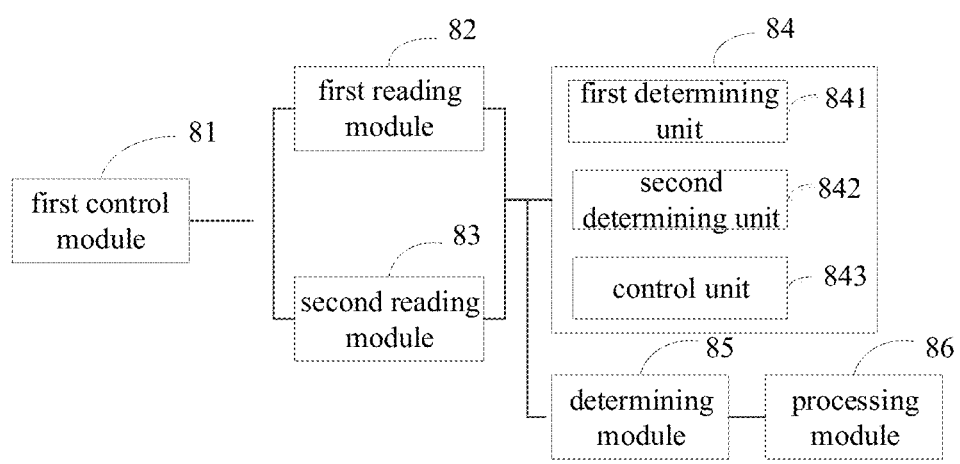
FIG. 10 is a structural diagram of a photographing processing device for a camera module according to another embodiment of the present disclosure.

FIG. 10 is a structural diagram of a photographing processing device for a camera module according to another embodiment of the present disclosure.

As shown in FIG. 10, the above second control module 84 may specifically include: a first determining unit 841, configured to determine a phase difference of an image currently acquired by the image sensor 100 in a first direction according to the first set of output values; a second determining unit 842, configured to determine a phase difference of the image in a second direction according to the second set of output values; a control unit 843, configured to perform focusing control according to the phase difference in the first direction and the phase difference in the second direction.

In a possible implementation form of the present disclosure, the above control unit 841 is specifically configured to: determine a first displacement amount of the image sensor 100 in the first direction according to the phase difference in the first direction; determine a second displacement amount of the camera module 500 in the second direction according to the phase difference in the second direction; control the camera module 500 to perform focusing according to the first displacement amount and the second displacement amount.

In another possible implementation form of the present disclosure, the above control unit 841 is further configured to: determine a phase difference of the image according to the phase difference in the first direction and the phase difference in the second direction; determine a rotation angle and displacement amount of the camera module 500 according to the phase difference; control the camera module 500 to perform focusing according to the rotation angle and displacement amount.

It can be understood that, the camera module 500 further includes a lens.

In another possible implementation form of the present disclosure, the above control unit 841 is further configured to: control the image sensor 100 and/or the lens to move for focusing.

In another possible implementation form of the present disclosure, the photographing processing device for a camera module further includes: a determining module 85, configured to determine a field depth of a currently shot object according to the phase difference in the first direction and the phase difference in the second direction; and a processing module 86, configured to perform blurring processing of the shot image according to the field depth.

It should be noted that, the explanation of the photography processing method for a camera module embodiment in the foregoing embodiments is also applicable to the photographing processing device for a camera module of this embodiment, and details are not described herein again.

The photographing processing device for a camera module provided by the embodiment of the present disclosure first controls a photosensitive unit array to enter a focusing mode, and then reads a first set of output values of M pairs of first focusing photosensitive units and a second set of output values of N pairs of second focusing photosensitive units, respectively, followed by performing focusing control according to the first set of output values and the second set of output values. By providing the photosensitive unit array with pairs of focusing photosensitive units having a plurality of arrangement directions, and using read output values of the focusing photosensitive units having different arrangement directions, focusing is performed, thereby improving speed, precision and accuracy of the dual-core focusing, enhancing the spatial and hierarchical sense of the image acquired by the image sensor and optimizing a blurring effect on the image.

Figure 11:
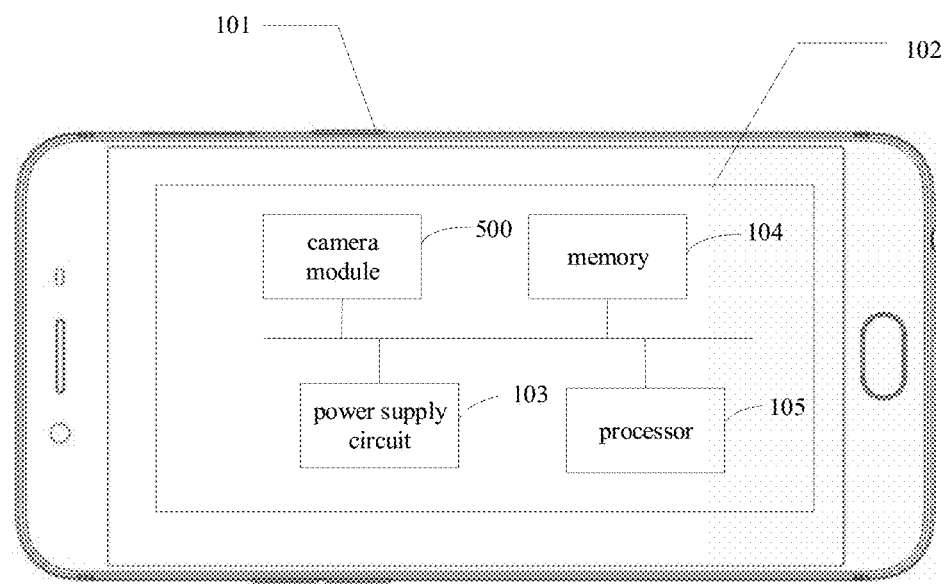
FIG. 11 is a structural diagram of a terminal according to an embodiment of the present disclosure.

A further embodiment of the present disclosure further provides a terminal. FIG. 11 is a structural diagram of terminal according to an embodiment of the present disclosure.

As shown in FIG. 11, the terminal includes a housing 101, a circuit board 102, a camera module 500, and a power supply circuit 103. Therein, the circuit board 102 is disposed in an inner space enclosed by the housing 101; and the power supply circuit 103 is configured to power each circuit or component of the terminal.

Specifically, the camera module 500 includes an image sensor 100, comprising: a photosensitive unit array 10, a filter unit array 20 arranged on the photosensitive unit array 10, and a microlens unit array 30 arranged on the filter unit array 20.

The photosensitive unit array 10 includes M pairs of first focusing photosensitive units 11 and N pairs of second focusing photosensitive units 12. A microlens unit 31 covers a filter unit and a pair of focusing photosensitive units. Therein, a center line of each pair of focusing photosensitive units is parallel to an arrangement direction of the pair of focusing photosensitive units;

An intersection angle between a center line of a pair of first focusing photosensitive units 11 and a center line of a pair of second focusing photosensitive units 12 is greater than 0 degree; and M and N are positive integers greater than or equal to one.

In a possible implementation form, the above terminal may further include a memory 104 and a processor 105.

The processor 105 and the memory 104 are disposed on the circuit board 102; the memory 104 is configured to store an executable program code; the processor 405 runs a program corresponding to the executable program code by reading the executable program code stored in the memory 104, for performing the following operations: controlling the photosensitive unit array 10 to enter a focusing mode; reading a first set of output values of the M pairs of first focusing photosensitive units 11; reading a second set of output values of the N pairs of second focusing photosensitive units 12; and performing focusing control according to the first set of output values and the second set of output values.

It should be noted that, the above description for embodiments of the image sensor and the photography processing method for a camera module is also applicable to the terminal in this embodiment, both have the same implementation principle, which is not elaborated here.

In the terminal provided by the embodiment of the present disclosure, the camera module includes a photosensitive unit array, a filter unit array arranged on the photosensitive unit array, and a microlens unit array arranged on the filter unit array. By providing the photosensitive unit array with pairs of focusing photosensitive units having a plurality of arrangement directions and using read output values of the focusing photosensitive units having different arrangement directions, focusing is performed, thereby improving speed, precision, and accuracy of the dual-core focusing.

To solve the above technical problem, an embodiment of the present disclosure provides a computer-readable storage medium having a computer program stored thereon. The program, when executed by a processor, implements the photography processing method for a camera module in the above described embodiment.

To solve the above technical problem, an embodiment of the present disclosure provides a computer program product. When instructions in the computer program product are executed by a processor, the photography processing method for a camera module in the above described embodiment is executed.

It should be noted that, relationship terms such as first and second are only used herein to distinguish an entity or operation from another entity or operation, and it is not necessarily required or implied that there are any actual relationship or order of this kind between those entities and operations. Moreover, terms such as "comprise", "comprising" and any other variants are intended to cover non-exclusive contains, so that the processes, methods, articles or devices including a series of elements not only include those elements but also include other elements that are not listed definitely, or also include the elements inherent in the processes, methods, articles or devices. In the case of no more restrictions, the elements defined by the statement "comprise one . . . " do not exclude that other same elements also exist in the processes, methods, articles or devices including the elements.

The logic and/or step described in other manners herein or shown in the flow chart, for example, a particular sequence table of executable instructions for realizing the logical function, may be specifically achieved in any computer readable medium to be used by the instruction execution system, device or equipment (such as the system based on computers, the system comprising processors or other systems capable of acquiring the instruction from the instruction execution system, device and equipment and executing the instruction), or to be used in combination with the instruction execution system, device and equipment. As to the specification, "the computer readable medium" may be any device adaptive for including, storing, communicating, propagating or transferring programs to be used by or in combination with the instruction execution system, device or equipment. More specific examples of the computer-readable medium comprise but are not limited to: an electronic connection (an electronic device) with one or more wires, a portable computer enclosure (a magnetic device), a random access memory (RAM), a read-only memory (ROM), an erasable programmable read-only memory (EPROM or a flash memory), an optical fiber device and a portable compact disk read-only memory (CDROM). In addition, the computer-readable medium may even be a paper or other appropriate medium capable of printing programs thereon, this is because, for example, the paper or other appropriate medium may be optically scanned and then edited, decrypted or processed with other appropriate methods when necessary to obtain the programs in an electric manner, and then the programs may be stored in the computer memories.

It should be understood that, each part of the present disclosure may be realized by hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

It should be noted that, reference throughout this specification to "an embodiment", "some embodiments", "an example", "a specific example", or "some examples" means that a particular feature, structure, material, or characteristic described in connection with the embodiment or example is included in at least one embodiment or example of the present disclosure. In this specification, exemplary descriptions of aforesaid terms are not necessarily referring to the same embodiment or example. Furthermore, the particular features, structures, materials, or characteristics may be combined in any suitable manner in one or more embodiments or examples. Moreover, those skilled in the art could combine different embodiments or different characteristics in embodiments or examples described in the present disclosure.

Although embodiments of present disclosure have been shown and described above, it should be understood that above embodiments are just explanatory, and cannot be construed to limit the present disclosure, for those skilled in the art, changes, alternatives, and modifications can be made to the embodiments without departing from spirit, principles and scope of the present disclosure.

What is claimed is:

1. A method of photography processing for a camera module, wherein the camera module comprises an image sensor, and the image sensor comprises a photosensitive unit array, a filter unit array arranged on the photosensitive unit array, and a microlens unit array arranged on the filter unit array;

wherein the photosensitive unit array comprises M pairs of first focusing photosensitive units with center lines parallel to each other and N pairs of second focusing photosensitive units with center lines parallel to each other, and a microlens unit covers a filter unit and a pair of focusing photosensitive units;

wherein an intersection angle between a center line of a pair of first focusing photosensitive units and a center line of a pair of second focusing photosensitive units is greater than 0 degree, and M and N are positive integers greater than or equal to 1;

wherein density of the focusing photosensitive units arranged on the vertical center line and horizontal center line of the image sensor is greater than that of the focusing photosensitive units arranged on two diagonal lines of the image sensor; and wherein the method comprises:
controlling the photosensitive unit array to enter a focusing mode;
reading a first set of output values of the M pairs of first focusing photosensitive units;
reading a second set of output values of the N pairs of second focusing photosensitive units; and
performing focusing control according to the first set of output values and the second set of output values.

2. The method of claim 1, wherein performing focusing control according to the first set of output values and the second set of output values comprises:
determining a phase difference of an image currently acquired by the image sensor in a first direction, according to the first set of output values;
determining a phase difference of the image in a second direction according to the second set of output values; and
performing the focusing control according to the phase difference in the first direction and the phase difference in the second direction.

3. The method of claim 2, wherein performing focusing control according to the phase difference in the first direction and the phase difference in the second direction comprises:
determining a first displacement amount of the image sensor in the first direction according to the phase difference in the first direction;
determining a second displacement amount of the camera module in the second direction according to the phase difference in the second direction; and
controlling the camera module to perform focusing according to the first displacement amount and the second displacement amount.

4. The method of claim 2, wherein performing focusing control according to the phase difference in the first direction and the phase difference in the second direction comprises:
determining a phase difference of the image according to the phase difference in the first direction and the phase difference in the second direction;
determining a rotation angle and a displacement amount of the camera module according to the phase difference of the image; and
controlling the camera module to perform focusing according to the rotation angle and the displacement amount.

5. The method of claim 3, wherein the camera module further comprises a lens; and
wherein controlling the camera module to perform focusing comprises:
controlling at least one of the image sensor or the lens to move for focusing.

6. The method of claim 4, wherein the camera module further comprises a lens; and
wherein controlling the camera module to perform focusing comprises:
controlling at least one of the image sensor or the lens to move for focusing.

7. The method of claim 2, further comprising:
determining a field depth of a currently shot object according to the phase difference in the first direction and the phase difference in the second direction; and
performing blurring processing of the shot image according to the field depth.

8. The method of claim 1, wherein the photosensitive unit array further comprises L pairs of third focusing photosensitive units with center lines parallel to each other, L is a positive integer greater than or equal to 1, and an intersection angle between a center line of a pair of third focusing photosensitive units and the center line of the pair of first focusing photosensitive units and an intersection angle between the center line of the pair of third focusing photosensitive units and the center line of the pair of second focusing photosensitive units are greater than 0 degree.

9. A terminal, comprising a housing, a circuit board, a camera module, and a power supply circuit, wherein the circuit board is disposed in an inner space enclosed by the housing, and the power supply circuit is configured to power each circuit or component of the terminal;
wherein the camera module comprises an image sensor, the image sensor comprises a photosensitive unit array, a filter unit array arranged on the photosensitive unit array, and a microlens unit array arranged on the filter unit array;
wherein the photosensitive unit array comprises M pairs of first focusing photosensitive units with center lines parallel to each other and N pairs of second focusing photosensitive units with center lines parallel to each other, a microlens unit covers a filter unit and a pair of focusing photosensitive units;
wherein an intersection angle between a center line of a pair of first focusing photosensitive units and a center line of a pair of second focusing photosensitive units is greater than 0 degree, and M and N are positive integers greater than or equal to 1; and
wherein density of the focusing photosensitive units arranged on the vertical center line and horizontal center line of the image sensor is greater than that of the focusing photosensitive units arranged on two diagonal lines of the image sensor.

10. The terminal of claim 9, further comprising:
a memory, and a processor, the processor and the memory being disposed on the circuit board,
wherein the memory is configured to store an executable program code; and the processor is configured to run a program corresponding to the executable program code by reading the executable program code stored in the memory, to perform the following operations:
controlling the photosensitive unit array to enter a focusing mode;
reading a first set of output values of the M pairs of first focusing photosensitive units;
reading a second set of output values of the N pairs of second focusing photosensitive units; and
performing focusing control according to the first set of output values and the second set of output values.

11. The terminal of claim 10, wherein performing focusing control according to the first set of output values and the second set of output values comprises:
determining a phase difference of an image currently acquired by the image sensor in a first direction, according to the first set of output values;
determining a phase difference of the image in a second direction according to the second set of output values; and
performing focusing control according to the phase difference in the first direction and the phase difference in the second direction.

12. The terminal of claim 11, wherein performing focusing control according to the phase difference in the first direction and the phase difference in the second direction comprises:
determining a first displacement amount of the image sensor in the first direction according to the phase difference in the first direction;
determining a second displacement amount of the camera module in the second direction according to the phase difference in the second direction; and
controlling the camera module to perform focusing according to the first displacement amount and the second displacement amount.

13. The terminal of claim 12, wherein the camera module further comprises a lens; and
wherein controlling the camera module to perform focusing comprises:
controlling at least one of the image sensor or the lens to move for focusing.

14. The terminal of claim 11, wherein performing focusing control according to the phase difference in the first direction and the phase difference in the second direction comprises:
determining a phase difference of the image according to the phase difference in the first direction and the phase difference in the second direction;
determining a rotation angle and a displacement amount of the camera module according to the phase difference of the image; and
controlling the camera module to perform focusing according to the rotation angle and the displacement amount.

15. The terminal of claim 14, wherein the camera module further comprises a lens; and
wherein controlling the camera module to perform focusing comprises:
controlling at least one of the image sensor or the lens to move for focusing.

16. The terminal of claim 11, further comprising:
determining a field depth of a currently shot object according to the phase difference in the first direction and the phase difference in the second direction; and
performing blurring processing of the shot image according to the field depth.

17. The terminal of claim 9, wherein the photosensitive unit array further comprises L pairs of third focusing photosensitive units with center lines parallel to each other, L is a positive integer greater than or equal to 1, and an intersection angle between a center line of a pair of third focusing photosensitive units and the center line of the pair of first focusing photosensitive units and an intersection angle between the center line of the pair of third focusing photosensitive units and the center line of the pair of second focusing photosensitive units are greater than 0 degree.

18. A non-transitory computer-readable storage medium, having a computer program stored thereon, wherein the program, when executed by a processor, implements a method of photography processing for a camera module; wherein the camera module comprises an image sensor, and the image sensor comprises a photosensitive unit array, a filter unit array arranged on the photosensitive unit array, and a microlens unit array arranged on the filter unit array;
wherein the photosensitive unit array comprises M pairs of first focusing photosensitive units with center lines parallel to each other and N pairs of second focusing photosensitive units with center lines parallel to each other, a microlens unit covers a filter unit and a pair of focusing photosensitive units;

wherein an intersection angle between a center line of a pair of first focusing photosensitive units and a center line of a pair of second focusing photosensitive units is greater than 0 degree, and M and N are positive integers greater than or equal to 1;

wherein the density of the focusing photosensitive units arranged on the vertical center line and horizontal center line of the image sensor is greater than that of the focusing photosensitive units arranged on two diagonal lines of the image sensor; and wherein the method comprises:
 controlling the photosensitive unit array to enter a focusing mode;
 reading a first set of output values of the M pairs of first focusing photosensitive units;
 reading a second set of output values of the N pairs of second focusing photosensitive units; and
 performing focusing control according to the first set of output values and the second set of output values.

* * * * *

UNITED STATES PATENT AND TRADEMARK OFFICE
CERTIFICATE OF CORRECTION

PATENT NO. : 11,082,605 B2  
APPLICATION NO. : 16/664313  
DATED : August 3, 2021  
INVENTOR(S) : Yuanqing Zeng Page 1 of 1

It is certified that error appears in the above-identified patent and that said Letters Patent is hereby corrected as shown below:

On the Title Page

Item (54) and in the Specification, Column 1, Lines 1-4 Please delete:
"METHOD OF PHOTOGRAPHY PROCESSING FOR CAMERA MODULE, TERMINAL, USING SAME AND STORAGE MEDIUM IMPLEMENTING SAME"

And insert:
-- METHOD OF PHOTOGRAPHY PROCESSING FOR CAMERA MODULE, TERMINAL USING SAME, AND STORAGE MEDIUM IMPLEMENTING SAME --

Signed and Sealed this  
Nineteenth Day of October, 2021

Drew Hirshfeld  
*Performing the Functions and Duties of the*  
*Under Secretary of Commerce for Intellectual Property and*  
*Director of the United States Patent and Trademark Office*